US007053729B2

(12) United States Patent  
Aguirre et al.

(10) Patent No.: US 7,053,729 B2  
(45) Date of Patent: May 30, 2006

(54) IMPEDENCE MATCHING ALONG VERTICLE PATH OF MICROWAVE VIAS IN MULTILAYER PACKAGES

(75) Inventors: Gerardo Aguirre, San Diego, CA (US); Christopher Gordon, San Diego, CA (US)

(73) Assignee: Kyocera America, Inc., San Diego, CA (US)

( * ) Notice: Subject to any disclaimer, the term of this patent is extended or adjusted under 35 U.S.C. 154(b) by 0 days.

(21) Appl. No.: 10/925,377

(22) Filed: Aug. 23, 2004

(65) Prior Publication Data

US 2006/0038633 A1    Feb. 23, 2006

(51) Int. Cl.  
     *H01P 3/08*      (2006.01)  
     *H05K 1/18*      (2006.01)

(52) U.S. Cl. .................. 333/33; 333/246; 174/262

(58) Field of Classification Search ............. 333/33, 333/32, 246, 238, 260; 174/262, 266  
See application file for complete search history.

(56) References Cited

U.S. PATENT DOCUMENTS

| | | | |
|---|---|---|---|
| 4,494,083 A | 1/1985 | Josefsson et al. |
| 4,498,122 A | 2/1985 | Rainal |
| 4,851,794 A | 7/1989 | Williams et al. |
| 5,801,599 A | 9/1998 | Flynn et al. |
| 5,830,301 A | 11/1998 | Sturzebecher et al. |
| 6,072,375 A | 6/2000 | Adkins et al. |
| 6,172,497 B1 | 1/2001 | Okumichi |
| 6,181,219 B1 | 1/2001 | Gailus et al. |
| 6,207,903 B1 | 3/2001 | Wen et al. |
| 6,388,208 B1 | 5/2002 | Kiani et al. |
| 6,538,538 B1 | 3/2003 | Hreish et al. |
| 6,570,102 B1 | 5/2003 | Miller et al. |
| 6,602,078 B1 | 8/2003 | Kwark |

FOREIGN PATENT DOCUMENTS

EP      1 341 354 A2      9/2003

OTHER PUBLICATIONS

Paper on Vertical Feedthroughs For Millimeter-Wave LTCC Modules by Johann Heyen, et al. pp. 411 through 414 (XP010680892) 2003.

IEEE Microwave and Wireless Components Letters, vol. No. 13, dated May 5, 2003 "Resonance Stub Effect in a Transition From a Through Via Hole to a Stripline in Multilayer PNBs".

(Continued)

*Primary Examiner*—Stephen E. Jones  
(74) *Attorney, Agent, or Firm*—Hogan & Hartson, L.L.P.

(57) ABSTRACT

High frequency matching in a multilayer ceramic package is accomplished by a radial stub arrangement provided in one or more of the ground planes of a stack of layers forming the package. A signal via extends vertically upwardly between a ball grid array at a bottom surface of the stack and a coplanar waveguide in the form of a signal trace on a top surface of the stack. Each radial stub arrangement surrounds the signal via and is formed by a central space in the ground plane which surrounds the via and a plurality of stub-forming spaces in the ground plane which extend radially outwardly from the central space. The stub-forming spaces form a plurality of radial stubs which extends inwardly from the ground plane to locations adjacent but spaced apart from the signal via. The discontinuities provided by the spaces behave as a shunt inductance connected to a series capacitance. The radial stub arrangements provide high frequency matching in an arrangement which is confined to the vertical path of the signal via, thereby enabling higher interconnect density in multilayer packages.

11 Claims, 2 Drawing Sheets

IMPEDENCE MATCHING ALONG VERTICLE PATH OF MICROWAVE VIAS IN MULTILAYER PACKAGES

BACKGROUND OF THE INVENTION

1. Field of the Invention

The present invention relates to multilayer packages, and more particularly to multilayer ceramic packages having a stack of layers with ground planes and signal traces coupled to signal vias disposed vertically within the stack.

2. History of the Prior Art

It is known in the art to provide multilayer ceramic packages in which signal traces are interconnected by vertical vias within a stack of layers. The various layers of the packages are provided with ground planes, and the package is typically disposed on a ball grid array (BGA). In addition to the signal vias, the stack is typically provided with a plurality of ground vias which interconnect the ground planes of the stack.

In multilayer ceramic packages of this type, it is frequently necessary or desirable to provide high frequency matching between the signal traces. This is usually accomplished by placing matching stubs alongside the signal traces in the 2-dimentional planar dimensions of the package. A disadvantage of such approach, however, is that it increases the required footprint for the via matching, and therefore results in packages with lower interconnect densities. Moreover, not only is the footprint enlarged by such approach, but matching of broadband bandwidths is more difficult and may require even greater space to accomplish.

The prior art includes various examples of techniques for providing high frequency matching in multilayer ceramic packages. U.S. Pat. No. 6,602,078 of Kwark shows an impedance matching arrangement having a vertical signal line. A ground spacer, together with the signal line and a dielectric medium, form a coaxial structure to provide impedance matching.

U.S. Pat. No. 6,388,208 of Kiani et al. shows a vertical via. Within each of plural layers, there are signal and ground segments. The size and shape of the electrically isolated segments provide an interconnection circuit with a predetermined impedance characteristic.

U.S. Pat. No. 5,830,301 of Sturzebecher, et al. discloses a stack of layers. A cylindrical via is surrounded by an annular dielectric region and outer ground planes are comprised of continuous pairs of ground plane segments.

Other examples in the prior art are provided by U.S. Pat. No. 4,498,122 of Rainal, U.S. Pat. No. 6,172,497 of Okumichi, U.S. Pat. No. 4,851,794 of Williams et al., U.S. Pat. No. 4,494,083 of Josefsson et al., U.S. Pat. No. 6,538,538 of Hreish et al., U.S. Pat. No. 6,072,375 of Adkins et al., U.S. Pat. No. 6,207,903 of Wen et al., U.S. Pat. No. 6,181,219 of Gailus et al., U.S. Pat. No. 6,570,102 of Miller et al., and U.S. Pat. No. 5,801,599 of Flynn et al.

In view of the shortcomings of the prior art, it would be desirable to provide a multilayer ceramic package in which high frequency matching is accomplished by a compact arrangement requiring a small footprint and thereby enabling higher interconnect density in such packages.

BRIEF DESCRIPTION OF THE INVENTION

The present invention provides improved multilayer packages in which high frequency matching is accomplished by a compact arrangement having a small foot-print and permitting high interconnect density of the packages. In the preferred embodiment described hereafter, the entire matching circuit between two signal traces occurs along the vertical paths of the vias coupled to the signal traces.

In a preferred embodiment of a multilayer package according to the invention, a vertical stack of layers is provided, each or at least some having a ground plane therein. A coplanar waveguide is disposed on a top surface of the vertical stack of layers, and a ball grid array is disposed at the bottom surface of the grid vertical stack of layers opposite the top surface. A via extends vertically through the stack of layers between the waveguide and the ball grid array.

In accordance with the invention, at least one of the ground planes is configured to form a plurality of radial stubs surrounding and spaced-apart from the via. At least the topmost ground plane adjacent to the top surface of the stack of layers and the second ground plane immediately below the topmost ground plane are each configured to form a plurality of radial stubs surrounding and spaced-apart from the via. The vertical via comprises a signal via, and the multilayer package includes a plurality of ground vias surrounding the signal via and each extending vertically through the stack of layers and interconnecting the ground planes of the stack.

The radial stubs are formed by a central space in the ground plane surrounding the via and a plurality of stub-forming spaces in the ground plane extending radially outwardly from the central space, so that adjacent pairs of the stub-forming spaces form radial stubs of the ground plane therebetween. Each of the radial stubs is spaced apart from the signal via at the central space in the ground plane to provide a discontinuity therebetween which behaves as a shunt inductance connected to a series capacitance. In the preferred embodiment, there are four stubs generally equally spaced about a circular array surrounding the signal via.

In accordance with a method for providing high frequency matching in a multilayer package according to the invention, a multilayer stack having a plurality of ground planes therein is provided. At least one signal trace is provided on the stack, and a signal via is coupled to the at least one signal trace and extends through the stack. According to the invention, a plurality of spaces are formed in at least one of the plurality of ground planes adjacent the signal via. The spaces form a plurality of stubs extending radially from the ground plane toward the signal via, with each of the stubs terminating in a location adjacent and spaced-apart from the signal via. Preferably, the step of forming a plurality of spaces includes forming a central space in the ground plane surrounding the signal via and forming a plurality of stub-forming spaces in the ground plane extending radially outwardly from the central space.

DETAILED DESCRIPTION OF THE PREFERED EMBODIMENT

Figure 1:
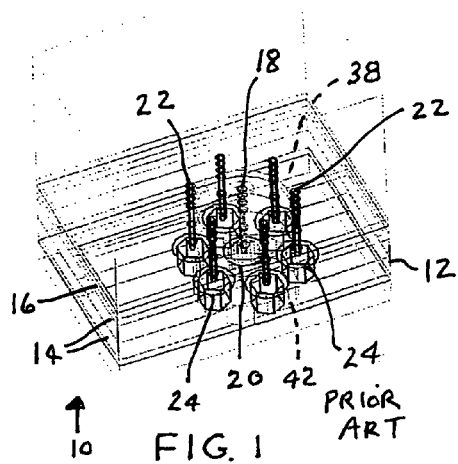
FIG. 1 is perspective view of a conventional multilayer package with the layers of the package shown in phantom so as better illustrate a signal via and a plurality of ground vias of the package.

FIG. 1 shows a conventional arrangement of a multilayer ceramic package 10. The package 10 includes a stack 12 of layers 14, each of which includes a ground plane 16. The stack 12 is shown in phantom so that vias 18, 22 of the package 10 can be better illustrated.

Figure 5:
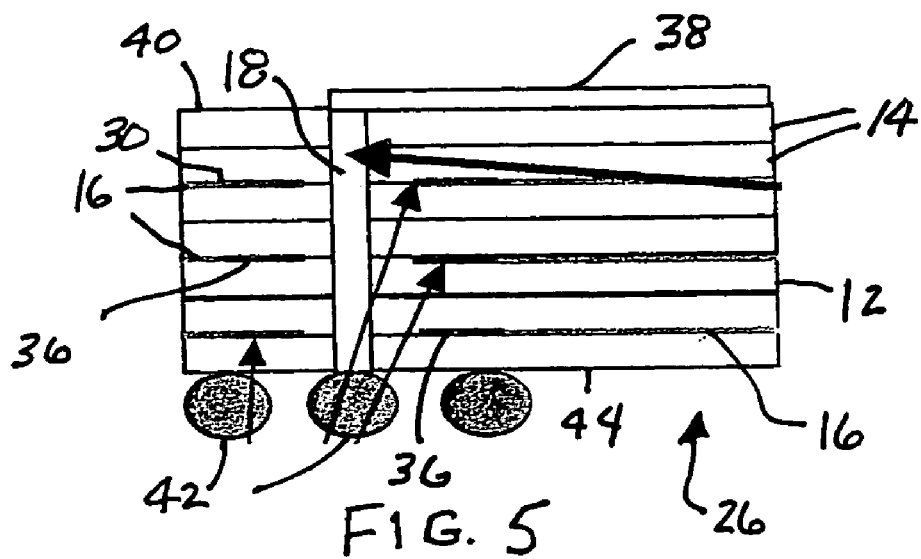
FIG. 5 is a sectional view a portion of the package of FIG. 3 illustrating a signal trace and interconnected signal via together with the radial stud arrangement of the ground planes.

The package 10 includes a signal via 18 which extends upwardly in vertical fashion through the package 10 from a signal via pad 20 at a lower end thereof. The signal via 18 is surrounded by a cluster of ground vias 22 which also extend upwardly through the package 10 and which interconnect to the ground planes 16 of the various layers 14. The lower ends of the ground vias 22 are coupled to ground via pads 24 at the lower ends thereof. The signal via pad 20 and the ground via pads 24 are coupled to a ball grid array 42 (BGA) which is shown in FIG. 5 and in phantom in FIG. 1. The upper end of the signal via 18 is coupled to a coplanar waveguide 38 which is also shown in FIG. 5 and in phantom in FIG. 1.

Figure 2:
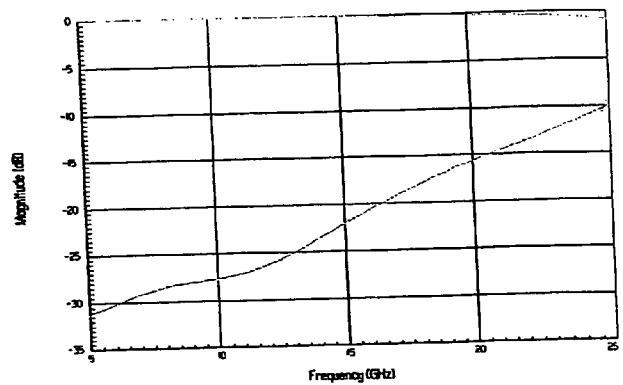
FIG. 2 is a chart of magnitude, in dB, of the return loss plotted as a function of frequency and illustrating the power reflected by the stack of FIG. 1.

FIG. 2 illustrates power reflected in the conventional multilayer ceramic package 10 of FIG. 1. FIG. 2 is a rectangular plot and as such comprises a plot of magnitude of reflected power in dB as a function of frequency in GHz. As shown in FIG. 2, the magnitude generally increases as a function of the frequency, so that little high frequency matching is provided between signal traces in the multilayer ceramic package 10.

Figure 3:
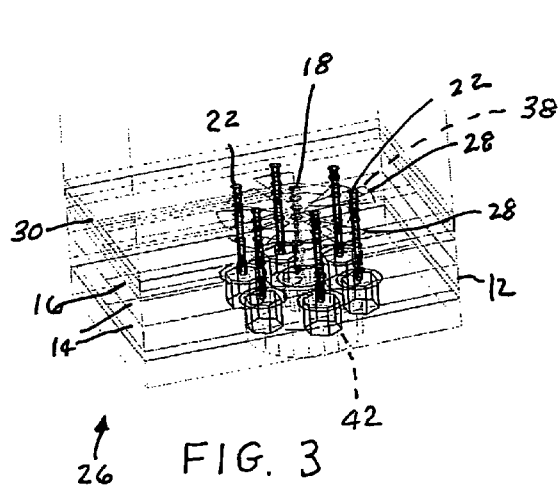
FIG. 3 is perspective view similar to that of FIG. 1 but with two of the ground planes provided with radial stub arrangements according to the invention.

FIG. 3 illustrates a multilayer ceramic package 26 in accordance with the invention. The package 26 of FIG. 3 is similar to the package 10 of FIG. 1, except that the ground planes 16 in several of the layers 14 are provided with radial stub arrangements 28. The radial stub arrangements 28 are shown in phantom in FIG. 3 and, as described in detail hereafter, are formed by openings within the ground planes 16. The openings form radial stubs which extending inwardly in radial fashion toward the signal via 18 and terminate at locations spaced apart from the signal via 18. The radial stubs of the radial stub arrangements 28 have the effect of providing high frequency matching between signal traces interconnected by vias such as the signal via 18 within the package 26.

Figure 4:
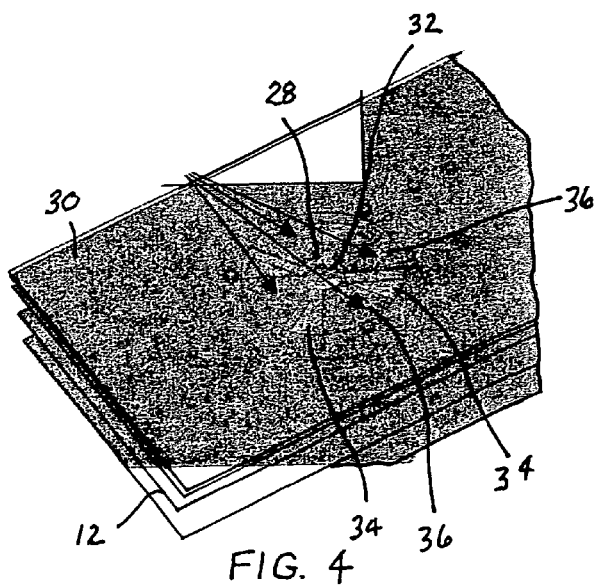
FIG. 4 is a perspective view of the stack of FIG. 3 and illustrating the radial stub arrangement in the topmost ground plane of the stack.

FIG. 4 shows the stack 12 of layers 14 of the package 26 of FIG. 3, with portions of the layers 14 shown in phantom. Only a topmost one 30 of the ground planes 16 is visible in terms of the details of the radial stub arrangement 28 formed therein. The radial stub arrangement 28 is formed by creating a central space 32 within the topmost ground plane 30 and plurality of stub-forming spaces 34 which extend radially outwardly from the central space 32. Adjacent pairs of the stub-forming spaces 34 form radial stubs 36 therebetween. In the present example, there are four stub-forming spaces 34 generally equally spaced around a circular array. The stub-forming spaces 34 form four radial stubs 36 generally equally spaced about the central space 32. It will be seen that each of the radial stubs 36 extends from the ground plane 30 to a location adjacent but spaced apart from the center of the central space 32. As described hereafter in connection with FIG. 5, the signal via 18 extends through the center of the central space 32, so that each of the radial stubs 36 terminates a location spaced a small distance from the signal via 18. These small spaces are discontinuities which behave as shunt inductances connected to series capacitances. As a result, high frequency matching is provided between signal traces interconnected by the signal vias 18.

FIG. 4 illustrates the radial stub arrangement 28 formed in the topmost ground plane 30. In the present example, a similar radial stub arrangement is formed in a second ground plane immediately below the top most ground plane 30. Radial stub arrangements can be formed in the ground planes 16 of the other layers 14, if desired.

FIG. 5 is a side sectional view of a portion of the multilayer ceramic package 26 of FIG. 3. As shown in FIG. 5, the package 26 is comprised of the vertical stack 12 of the layers 14. Each of the layers 14 has a ground plane 16. A coplanar wave-guide 38 in the form of a signal trace is disposed on a top surface 40 of the stack 12 and is coupled to the signal via 18. The signal via 18 is vertically disposed within the stack 12 and extends upwardly in vertical fashion between a ball grid array 42 disposed at a bottom surface 44 of the stack 12 and the coplanar waive guide 38 at the top surface 40 thereof.

In the example of FIG. 5, both of the ground planes 16 within the stack 12 are provided with the radial stub arrangement 28. As shown in FIG. 5, the radial stubs 36 of each such arrangement 28 extend from the ground plane 16 to a location adjacent but spaced apart from the signal via 18. This is as described in FIG. 4.

Figure 6:
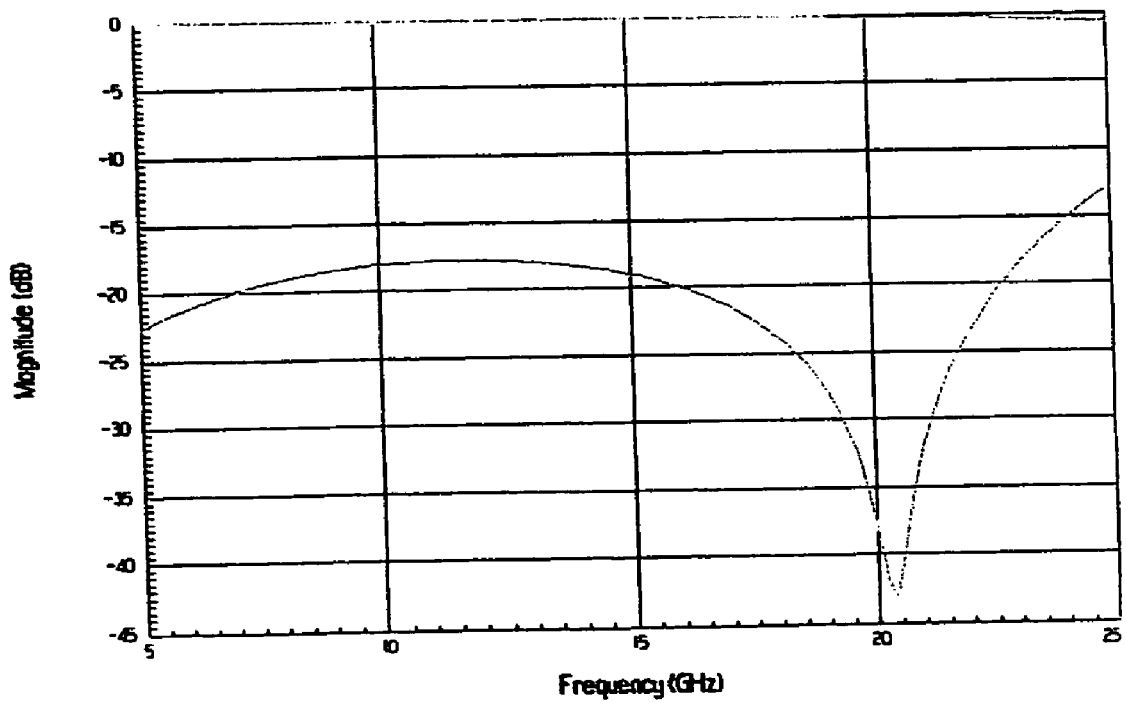
FIG. 6 is a chart similar that of FIG. 2 but illustrating the improved operation of the package of FIG. 3 in accordance with the invention.

FIG. 6 is a rectangular plot illustrating the return loss of the multilayer ceramic package 26 which is provided with the radial stub arrangements 28 according to the invention. Unlike the plot of FIG. 2 which corresponds to the conventional package arrangement of FIG. 1, the plot of FIG. 6 increases slightly with increasing frequency, before dropping to a magnitude of approximate −42 dB at a frequency of approximately 21 GHz. Thereafter, the plot again increases as the frequency increases. The magnitude of −42 dB at 21 GHz represents a reflectivity of less than 1% at this frequency. The radial stub arrangement 28 can be designed to provide such characteristics at selected frequencies, as desired. This allows for the design of amplifiers which have relatively small gains. The relatively small spacings of typically a few mills between the radial stubs 36 and the signal via 18 provide discontinuities which behave as shunt inductance connected to a series capacitance, as noted above.

The presently disclosed embodiment is to be considered in all respect as illustrated and not restrictive, the scope of the invention being indicated by the appending claims, rather than the foregoing description, and all changes which come within the meaning and range of equivalency of the claims are therefore intended to be embraced herein.

We claim:

1. A multilayer package comprising:
   a vertically stack of layers, each having a ground plane therein;
   a coplanar waveguide disposed on a top surface of the vertical stack of layers;
   a ball grid array disposed at a bottom surface of the vertical stack of layers opposite the top surface;
   a via extending vertically through the stack of layers between the waveguide and the ball grid array; and
   at least one of the ground planes being configured to form a plurality of radial stubs surrounding and spaced apart from the via.

2. A multilayer package according to claim 1, wherein a topmost ground plane adjacent to the top surface of the vertical stack of layers and a second ground plane immediately below the topmost ground plane are each configured to form a plurality of radial stubs surrounding and spaced apart from the via.

3. A multilayer package according to claim 1, wherein the coplanar waveguide forms a signal trace on the vertical stack, the vertical stack has at least one additional signal trace thereon and the radial stubs provide high frequency matching between the signal traces.

4. A multilayer package according to claim 1, wherein the via comprises a signal via, and further including a plurality of ground vias surrounding the signal via and each extending vertically through the stack of layers and interconnecting the ground planes of the stack.

5. A multilayer package according to claim 1, wherein the radial stubs are formed by a central space in the ground plane surrounding the via and a plurality of stub-forming spaces in the ground plane extending radially outwardly from the central space, adjacent pairs of the stub-forming spaces forming radial stubs of the ground plane therebetween.

6. A multilayer package according to claim 5, wherein each of the radial stubs is spaced apart from the via at the central space in the ground plane to provide a discontinuity therebetween which behaves as a shunt inductance connected to a series capacitance.

7. A multilayer ceramic package comprising:
a multilayer stack having a plurality of ground planes therein;
a plurality of signal traces on the stack, at least one of the signal traces being coupled to a signal via extending downwardly therefrom through the stack; and
at least one of the ground planes having a plurality of stubs extending radially therefrom to locations adjacent and spaced-apart from the signal via to provide high frequency matching between the plurality of signal traces.

8. A multilayer ceramic package according to claim 7, wherein the plurality of stubs are formed by spaces in the ground plane.

9. A multilayer ceramic package according to claim 8, wherein there are four stubs generally equally disposed about a circular array surrounding the signal via.

10. A method for providing high frequency matching in a multilayer package comprising the steps of:
providing a multilayer stack having a plurality of ground planes therein;
providing at least one signal trace on the stack;
providing a signal via coupled to at least one signal trace and extending through the stack; and
forming a plurality of spaces in at least one of the plurality of ground planes adjacent the signal via, the spaces forming a plurality of stubs extending radially from the ground plane toward the signal via, each of the stubs terminating in a location adjacent and spaced-apart from the signal via.

11. A method according to claim 10, wherein the step of forming a plurality of spaces includes forming a central space in the at least one of the plurality of ground planes surrounding the signal via and forming a plurality of stub-forming spaces in the at least one of the plurality of ground planes extending radially outwardly from the central space.

* * * * *